United States Patent [19]
Fukuda

[11] Patent Number: 6,094,371
[45] Date of Patent: Jul. 25, 2000

[54] MEMORY DEVICE WITH FERROELECTRIC CAPACITOR

[75] Inventor: Motoyasu Fukuda, Kawasaki, Japan

[73] Assignee: Fujitsu Limited, Kawasaki, Japan

[21] Appl. No.: 09/361,609

[22] Filed: Jul. 27, 1999

[30] Foreign Application Priority Data

Jul. 29, 1998 [JP] Japan ................... 10-214522

[51] Int. Cl.[7] .................................. G11C 11/22
[52] U.S. Cl. .................. 365/145; 365/149; 365/210; 365/230.06
[58] Field of Search ................... 365/145, 149, 365/210, 230.06

[56] References Cited

U.S. PATENT DOCUMENTS 5,307,304  4/1994  Saito et al. ................... 365/145
5,615,145  3/1997  Takeuchi et al. ............... 365/145
5,898,609  4/1999  Yoo ............................ 365/145

*Primary Examiner*—Huan Hoang
*Attorney, Agent, or Firm*—Armstrong, Westerman, Hattori, McLeland & Naughton

[57] ABSTRACT

Each ferroelectric memory cell has a ferroelectric capacitor connected between a transfer gate and a plate line, and a coupling capacitor connected between one plate electrode of the ferroelectric capacitor and a common line. For each row in a memory cell array, there are provided an erase switch connected between the common line and an erase potential VE, and another erase switch connected between the plate line and a ground potential, wherein these erase switches are turned on to erase all the memory cells in a lump with activating an erase signal. If an intermediate plate electrode is provided between a pair of the plate electrodes of the ferroelectric capacitor, and connected to the common line, the coupling capacitor can be omitted.

16 Claims, 15 Drawing Sheets

MEMORY DEVICE WITH FERROELECTRIC CAPACITOR

BACKGROUND OF THE INVENTION

1. Field of the Invention

The present invention relates to a ferroelectric memory device which employs a ferroelectric capacitor and a transfer gate as a memory cell.

2. Description of the Related Art

Since an electric charge accumulated at a plate electrode pair of a capacitor is retained by spontaneous polarization of a ferroelectric, the ferroelectric memory device is nonvolatile and does not require any refreshing operation. There are two types of ferroelectric memory cell, one has a ferroelectric capacitor instead of a paraelectric capacitor connected to a transfer gate in series, and the other has a ferroelectric in stead of a paraelectric between a floating gate and a control gate of an EPROM transistor.

In the latter type of ferroelectric memory device, such one is disclosed (Japanese Laid-open Patent Publication No. 8-235872), in which write transistors are coupled between the respective floating gates and bit lines in order to erase memory cell contents row by row with the write transistors turning on row by row. However, in the former ferroelectric memory device, no construction for collectively erasing is disclosed at all.

FIG. 12 shows a schematic construction of a prior-art ferroelectric memory device. In FIG. 12, a 2×2 memory cell array is shown for simplification.

In a memory cell 10, one plate electrode of a ferroelectric capacitor 11 is connected via a transfer gate 12 to a bit line BL0, and the other plate electrode of the ferroelectric capacitor 11 is connected to a plate line PL0. A voltage applied to the ferroelectric capacitor 11 in the direction of an arrow illustrated in FIG. 12 is denoted as VF, and the positive direction of a dielectric polarization P of the ferroelectric in the ferroelectric capacitor 11 is assumed to be the direction of another arrow illustrated in FIG. 12. The memory cell content of the memory cell 10 is defined as "0" when the dielectric polarization P is the positive direction at VF=0.

Operation of the ferroelectric memory device is similar to those of a DRAM.

(1) A read operation for the memory cell 10 in which "1" is stored

Referring to FIG. 13, a description will be given of the read operation for the memory cell 10 in which "1" is stored. Each hysteresis loop in FIG. 13 is the same and it denotes the relationship between electric field intensity E applied to the ferroelectric in the capacitor 11 with voltage VF and dielectric polarization P. The black dots show states (E, P) at respective time.

At a time t0, a word line WL0 and the plate line PL0 are low, the transfer gate 12 is off, and the ferroelectric is at a state S00. Further, a potential of a pair of complementary bit lines BL0 and *BL0 is reset at 0V by a bit line reset circuit 20. Furthermore, a sense amplifier 21 is inactive.

A control circuit 22 generates various control signals on the basis of a row address strobe signal *RAS, a column address strobe signal *CAS, and a write enable signal *WE ("*" denotes that its signal is low active), which are from the exterior. An address ADR is provided to a row address buffer register 23, the control circuit 22 provides a latch signal to the clock input of the row address buffer register 23 in response to a fall of the row address strobe signal *RAS, and causes the bit line reset circuit 20 to finish the resetting.

The output of the row address buffer register 23 is decoded by a row decoder 24, and the word line WL0 and the plate line PL0 rise at a time t1 when a timing signal provided from the control circuit 22 to the row decoder 24 becomes active.

When a content of the memory cell 10 connected to the bit line BL0 is read, a dummy word line DWL0 is raised in order to cause a dummy cell 30, which is connected to the bit line *BL0 complementary to the bit line BL0, to output the content thereof at the same time the word line WL0 rises. To the contrary, when reading a content of a memory cell connected to the bit line *BL0, a dummy word line DWL1 is raised in order to cause a dummy cell 31 connected to the bit line BL0 to output a content thereof at the same time when the word line WL0 rises.

The transfer gate 12 is turned on by a rise of the word line WL0, and a positive charge is pushed out from the ferroelectric capacitor 11 by a rise of the plate line PL0, whereby a positive charge flows via the transfer gate 12 to the bit line BL0 to cause the bit line BL0 to rise a little.

Simultaneously, a positive charge flows from the dummy cell 30 to the bit line *BL0, and the amount thereof is smaller than that from a memory cell in which "1" is stored, but greater than that from a memory cell in which "0" is stored. Thereby, the potential difference between the bit line pair BL0 and *BL0 arise. The voltage VF applied to the ferroelectric which is almost equal to the potential difference between the plate line PL0 and the bit line BL0 becomes positive by a rise of the plate line PL0, the dielectric polarization P is reversed, and the ferroelectric is turned into a state S01.

Next, at a time t2, the sense amplifier 21 is activated by a signal coming from the control circuit 22, and the potential difference is amplified, whereby the voltage VF becomes zero. The ferroelectric enters into a state S02 with spontaneous polarization.

An address ADR is provided to a column address buffer register 33. The control circuit 22 provides a latch pulse to the clock input of the column address buffer register 33 in response to a fall of the column address strobe signal *CAS. The output of the column address buffer register 33 is decoded by a colum decoder 34, and the column selection line CSL0 is caused to rise by a timing signal from the control circuit 22 at a time t3, whereby a column gate 35 is turned on, the signal on the bit lines BL0 and *BL0 goes through the column gate 35 to data bus lines DB and *DB, and are amplified and retained by an I/O buffer circuit 36, from which the signal is outputted as DATA.

At a time t4, the potential of the plate line PL0 is caused to fall by a timing signal from the control circuit 22 to the row decoder 24, whereby the voltage VF becomes negative to cause the spontaneous polarization to be reversed, and the ferroelectric is turned from the state S03 into a state S04.

At a time t5, on one hand, potentials of the word line WL0 and dummy word line DWL0 are caused to fall by a timing signal from the control circuit 22 to the row decoder 24, and on the other hand, the sense amplifier 21 becomes inactive by a signal from the control circuit 22 to the sense amplifier 21. Thereby, a potential of the bit line BL0 falls, the voltage VF returns to 0V, and the ferroelectric enters into the state S05 which is the same as the initial state S00.

(2) A read operation for the memory cell 10 in which "0" is stored.

If "0" is stored in the memory cell 10 at the time t0, the potential of the bit line BL0 is lower than that of the bit line *BL0 at the time t2. Therefore, the bit line BL0 becomes low with the activation of the sense amplifier 21, and the voltage VF is further raised, and next, the potential VF falls to 0V with a fall of the potential of the plate line PL0 at the time t4. Since the voltage VF has only a positive pulse, after a read operation has finished, the memory cell 10 becomes the original state where "0" is stored.

(3) WRITE operation of "0" for the memory cell 10

FIG. 14 are time charts showing operation of writing "0" into the memory cell 10 in which "1" has been stored. The operation from the time t0 to t3 is the same as those from the time t0 to t3 in FIG. 13.

At the time t3, a write enable signal WE rises in response to a fall of the write enable signal *WE, whereby writing control is commenced. At the time t3, the column gate 35 is turned on, whereby low and high writing potentials on the data bus lines DB and *DB go through the column gate 35 onto the bit lines BL0 and *BL0, respectively. Thereby, the voltage VF is caused to rise, and the ferroelectric enters into a state S13.

At the time t4, the plate line PL0 falls, and the voltage VF falls to 0V. The ferroelectric enters into a state S14 with spontaneous polarization, and the memory cell 10 becomes a state "0".

At the time t5, the potentials of the word line WL0 and the dummy word line DWL0 are caused to fall. In addition, the sense amplifier 21 becomes inactive. Thereby, the potential of the bit line *BL0 falls. The voltage VF remains at 0V, and the ferroelectric is in the state S15 which is the same as the state S14.

(4) WRITE operation of "1" for the memory cell 10

When writing "1" into the memory cell 10, the potentials of the bit lines BL0 and *BL0 do not change at the time t3 in FIG. 14. Next, the voltage VF falls at the time t4 as the same as in FIG. 13. Next, the voltage VF returns to 0V at the time t5 as the same as in FIG. 13. Thus, the memory cell 10 becomes a state "1".

FIG. 15 shows a schematic construction of another prior-art ferroelectric memory device.

In the device, a pair of memory cells 10 and 10A are employed to store 1 bit, instead of using the dummy cell 30 shown in FIG. 12. And, by writing complementary values in the memory cells 10 and 10A, the potential difference between the bit line pair BL0 and *BL0 is made greater than in the case of FIG. 12 when reading out.

Since ferroelectric memory devices are non-volatile and easy to write, they can be used for IC cards to handle electronic cash in banks, etc. In this case, erasing of the memory contents only in a software manner is not sufficient in view of security, therefore it is necessary to erase the memory contents in a hardware manner.

However, since, in the above described prior-art ferroelectric memory device, the memory contents must be erased bit by bit with repeating normal writing operation, the time required for erasing becomes longer, resulting in an increase in consumption power. The problem becomes more serious with an increase in memory capacity.

SUMMARY OF THE INVENTION

Therefore, it is an object of the present invention to provide a ferroelectric memory device which is capable of erasing the contents of a plurality of memory cells in a lump.

In the first aspect of the present invention, there is provided a ferroelectric memory device comprising ferroelectric memory cell array in rows and columns, each ferroelectric memory cell of a part of the memory cell array including: a ferroelectric capacitor having first and second plate electrodes, the second plate electrode being connected to a plate line; a transfer gate having a control input and a current pass, the current pass being connected between a bit line and the first plate electrode; and a coupling capacitor connected between the first plate electrode and a common line, wherein the bit line is common to memory cells in the same column, the plate line is common to memory cells in the same row, and the common line is common to memory cells in the same row, wherein the ferroelectric memory device further comprising: a first erase switch having a control input and a current pass, the current pass thereof being connected between the plate line and a conductor at a first potential, the first erase switch being turned on in response to an erase signal; and a second erase switch having a control input and a current pass, the current pass thereof being connected between the common line and a conductor at a second potential, the second erase switch being turned on in response to the erase signal.

Letting the capacitances of the ferroelectric capacitor and coupling capacitor and a potential difference between the first and second potentials CF, C, and VE, respectively, voltage VF=VE·C/(CF+C) is applied to the ferroelectric capacitor when erasing. VE and C are determined so that the direction of the spontaneous polarization of ferroelectric is reversed by application of the voltage VF. By application of the voltage VF, the logic state of a cell is turned into the other logic state, and the other logic state remains even after the first and second erase switches being off.

With the first aspect of the present invention, by activation of the erase signal, in regard to each of a plurality of ferroelectric memory cells, one or the other state becomes the other state, whereby the contents of the plurality of ferroelectric memory cells are erased in a lump.

In the second aspect of the present invention, there is provided a ferroelectric memory device comprising ferroelectric memory cell array in rows and columns, each ferroelectric memory cell of a part of the memory cell array including: a ferroelectric capacitor having first, intermediate and second plate electrodes, the intermediate plate electrode being disposed between the first and second plate electrodes, the intermediate plate electrode being connected to a common line, the second plate electrode being connected to a plate line; and a transfer gate having a control input and a current pass, the current pass being connected between a bit line and the first plate electrode, wherein the bit line is common to memory cells in the same column, the plate line is common to memory cells in the same row, and the common line is common to memory cells in the same row, the ferroelectric memory device further comprising: a first erase switch having a control input and a current pass, the current pass thereof being connected between the plate line and a conductor at a first potential, the first erase switch being turned on in response to an erase signal; and a second erase switch having a control input and a current pass, the current pass thereof being connected between the common line and a conductor at a second potential, the second erase switch being turned on in response to the erase signal.

With the second aspect of the present invention, in regard to a plurality of ferroelectric memory cells, a potential difference (erasing voltage) between the first and second potential is applied between the intermediate plate electrode and the plate electrode at the plate line side of the ferroelectric capacitor in response to the erase signal, whereby the polarization's becomes in a same direction, and the contents of a plurality of ferroelectric memory cells are erased in a lump. Although the erasing is made weaker than in the case of the first aspect, the erase potential can be suppressed to be lower than in the case of the first aspect.

Other aspects, objects, and the advantages of the present invention will become apparent from the following detailed description taken in connection with the accompanying drawings.

DESCRIPTION OF THE PREFERRED EMBODIMENTS

Figure 1:
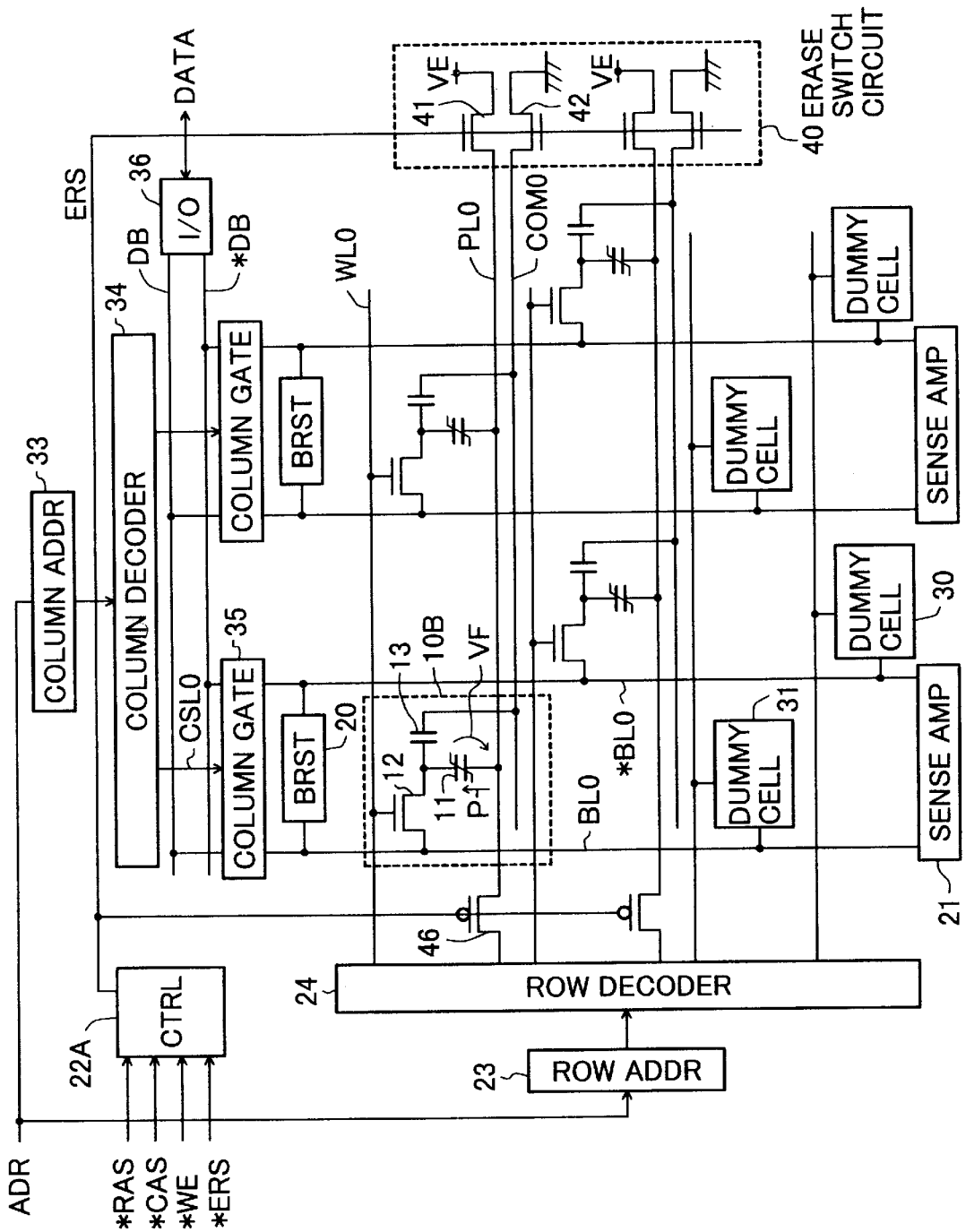
FIG. 1 is a schematic diagram showing a ferroelectric memory device according to the first embodiment of the present invention.

Referring now to the drawings, wherein like reference characters designate like or corresponding parts throughout several views, preferred embodiments of the present invention are described below.

It should be noted that the use of the term "connected" indicates an electrical connection between two elements and can include an intervening element between the two "connected" elements.

First Embodiment

FIG. 1 shows a schematic structure of a ferroelectric memory device according to the first embodiment of the present invention. Description of part identical to those in FIG. 12 and described above is omitted.

In a memory cell 10B, one plate electrode of a coupling capacitor 13 is connected to the node between the ferroelectric capacitor 11 and the transfer gate 12 while the other plate electrode of the coupling capacitor 13 is connected to a common line COM0. This is the same as those in the other memory cells in the same row.

An erase switch circuit 40 is provided with an NMOS transistor 41 whose current pass is connected between a conductor at an erase potential VE and a plate line PL0, and an NMOS transistor 42 whose current pass is connected between a conductor at a ground potential and a common line COM0. An erase signal ERS coming from the control circuit 22A is provided to the gate electrodes of the NMOS transistors 41 and 42.

Outputs of the row decoder 24 with respect to the plate lines are at 0V when rows are not selected even if in an erase operation period. Therefore, a plate line disconnection/connection switch 46, which is a PMOS transistor, is connected between the plate line PL0 and an output of the row decoder 24 in order to disconnect the output from the plate line PL0 when erasing, and an erase signal ERS is provided from the control circuit 22A to the gate electrode of the switch 46.

This is the same as other memory cell rows.

An erase signal *ERS of negative pulse is provided to a control circuit 22A, and, in response thereto, the control circuit 22A provides the erase signal ERS of positive pulse to the gate electrodes of all the NMOS transistors in the erase switch circuit 40 and the gate electrodes of the plate line disconnection/connection switches, including the switch 46, connected to the plate lines.

Figure 12:
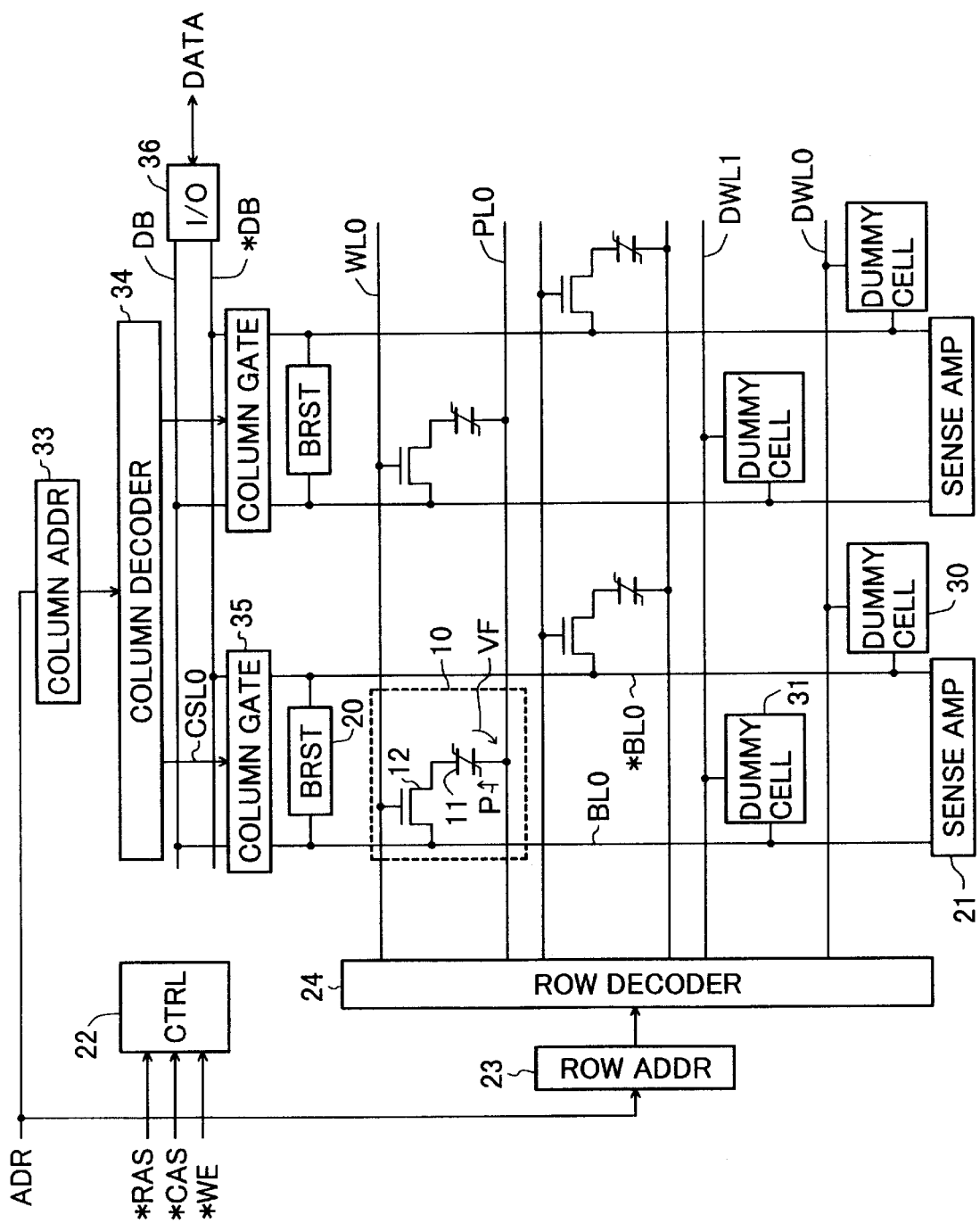
FIG. 12 is a schematic diagram showing a ferroelectric memory device in the prior art.

Other construction is identical to that in FIG. 12.

Next, a description is given of operation of the embodiment constructed as described above.

In read and write operations, the erase signals *ERS and ERS are high and low, respectively, whereby the erase switch circuit 40 are off, the plate line PL0 and the common line COM0 are open ends. And the common line COM0 is insulated from the ferroelectric capacitor 11 by the coupling capacitor 13, and is in a floating state. Also, all the plate line disconnection/connection switches including the switch 46 are on.

Figure 13:
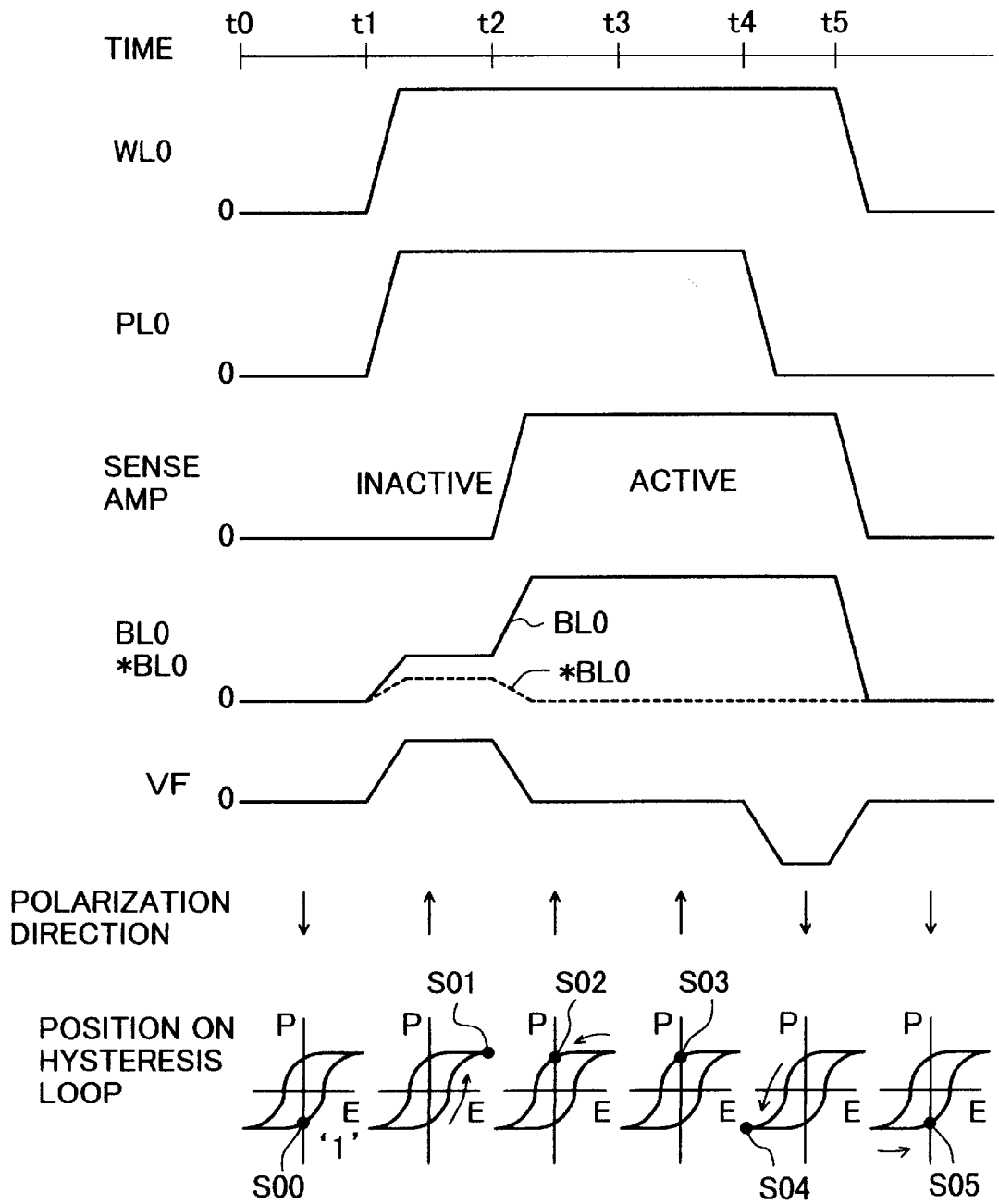
FIG. 13 are time charts showing a read operation of the device shown in FIG. 12.
Figure 14:
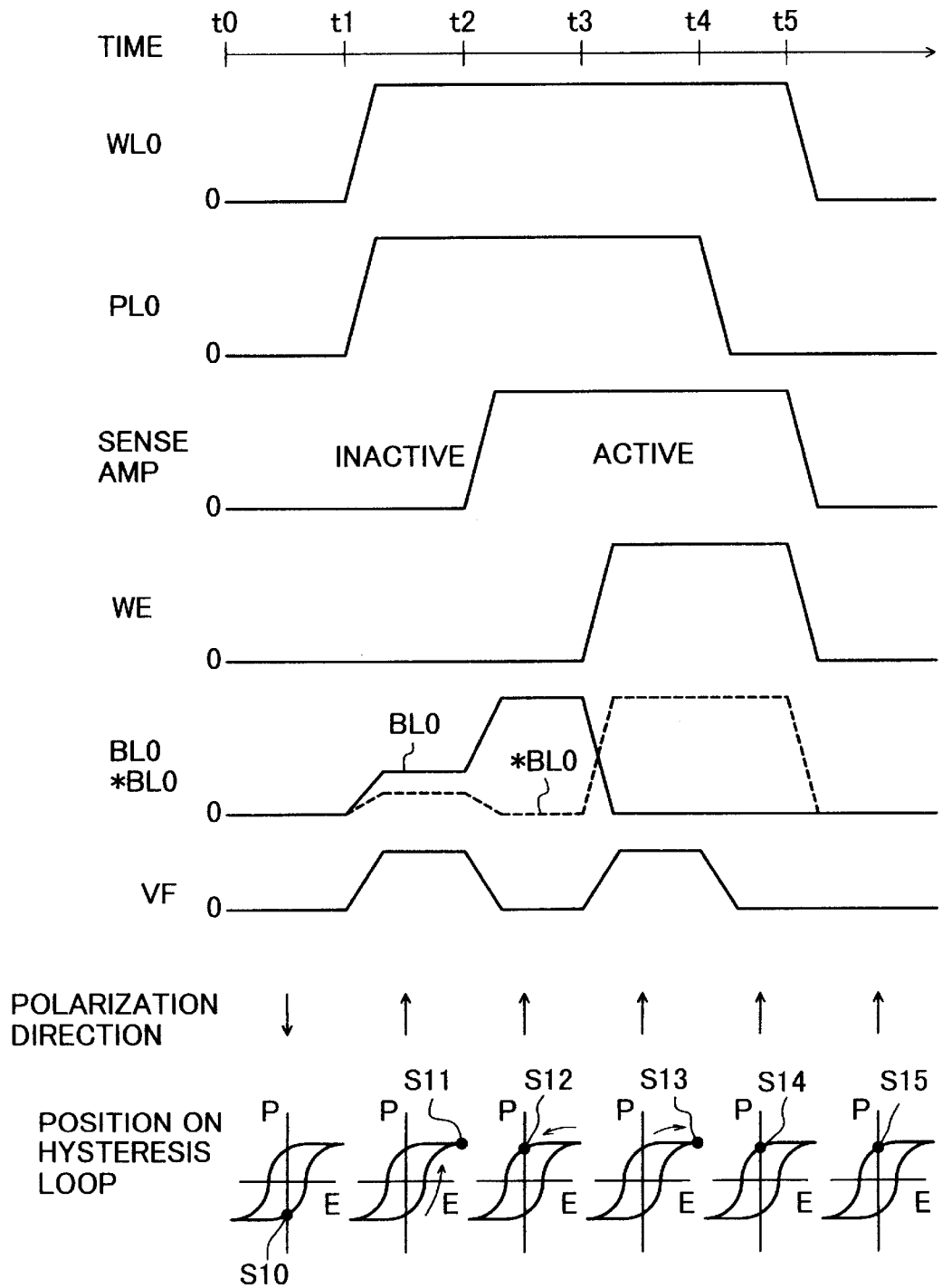
FIG. 14 are time charts showing a write operation of the device shown in FIG. 12.

Therefore, the read and write operations are, respectively, the same as those described with reference to FIGS. 13 and 14.

Figure 2:
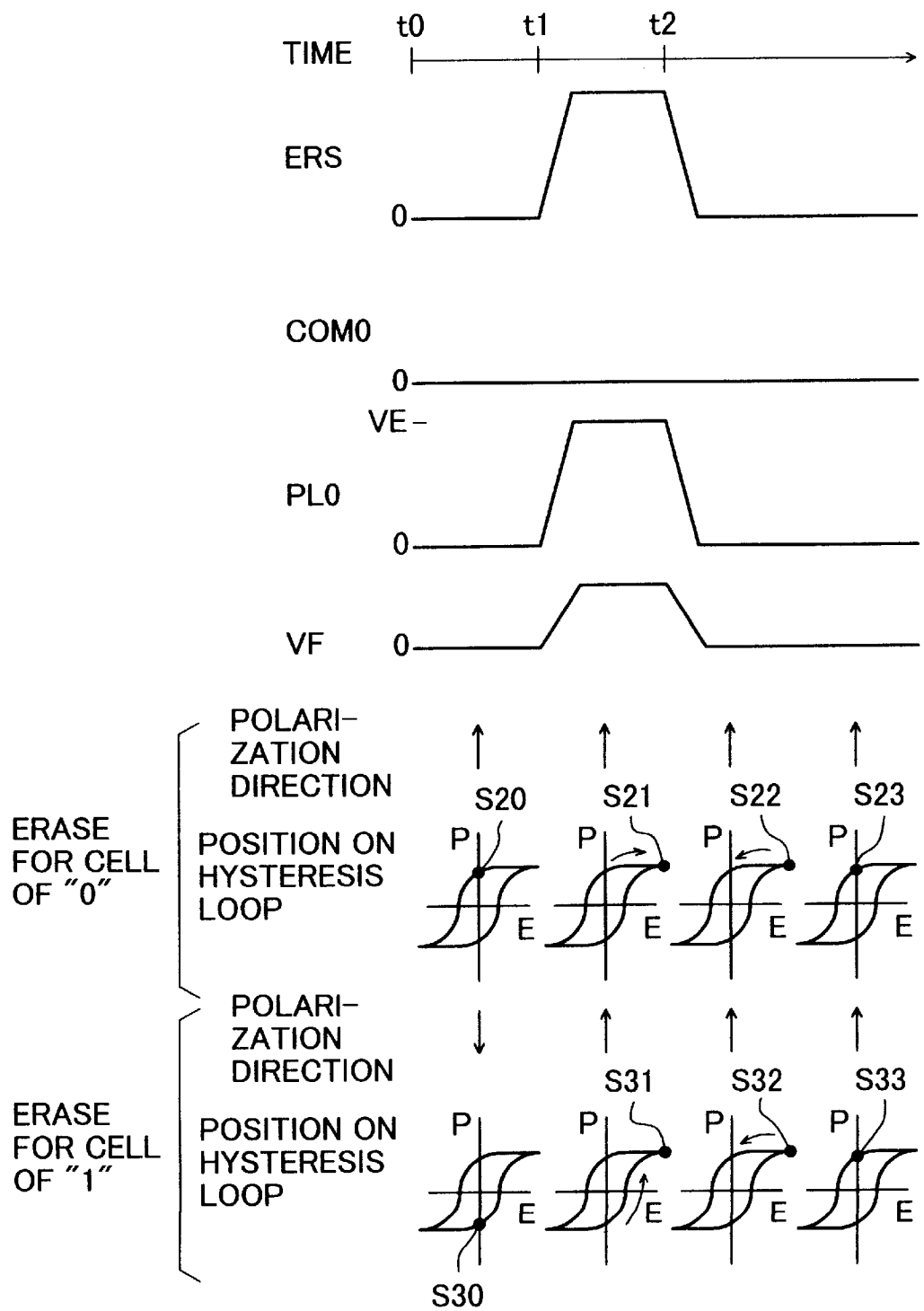
FIG. 2 are time charts showing erase operation of the device shown in FIG. 1.

FIG. 2 are time charts showing an erase operation of the device of FIG. 1, wherein the states of ferroelectric are denoted as black points on hysteresis loops with respect to erase by writing "0" into a cell of "0" and a cell of "1".

At a time t0, as an initial state, the erase signal ERS, the common line COM0, the plate line PL0 and voltage VF are at 0V. In addition, the word line WL0, the bit line pair BL0 and *BL0 are also 0V.

The control circuit 22A raises the erase signal ERS in response to a fall of the erase signal *ERS at the time t1, whereby the plate line disconnection/connection switches including the switch 46 are turned off, and the NMOS transistors 41 and 42 are turned on. Thus, an erase voltage VE is applied between the coupling capacitor 13 and the ferroelectric capacitors 11 connected in series.

Letting the capacities of the ferroelectric capacitor 11 and the coupling capacitor 13 be CF and C, respectively, a voltage of VF=VE·C/(CF+C) is applied to the ferroelectric capacitor 11. The VE and C are determined so that the spontaneous polarization of the ferroelectric in one logic state is reversed by application of the voltage VF. By application of the voltage VF, a cell in this logic state is turned into the other logic state, and a cell in the other logic state remains in its state. Namely, a cell "1" is turned from a state S30 into a state S31 and a cell of "0" is turned from a state S20 into a state S21.

The control circuit 22A lets the erase signal ERS fall in response to a rise of the erase signal *ERS at the time t2, whereby all the transistors of the erase switch circuit 40 are turned off and the plate line disconnection/connection switches including the switch 46 are turned on to cause the plate line PL0 falls to 0V. Thus, the voltage VF becomes 0V, a cell of "0" is turned from a state S22 into a state S23, and a cell of "1" is turned from a state S32 into a state S33.

Accordingly, each of the contents of all the memory cells becomes "0".

According to the first preferred embodiment, since all the memory cells are erased in a lump, the erasing speed can be accelerated. In addition, since the erasing is carried out in a state where the circuits 21, 23, 24, 33, 34 and 35 are inactive, power consumption can be further reduced than in a case where addressing memory cells one by one and erasing the contents thereof one by one.

Second Embodiment

Figure 3:
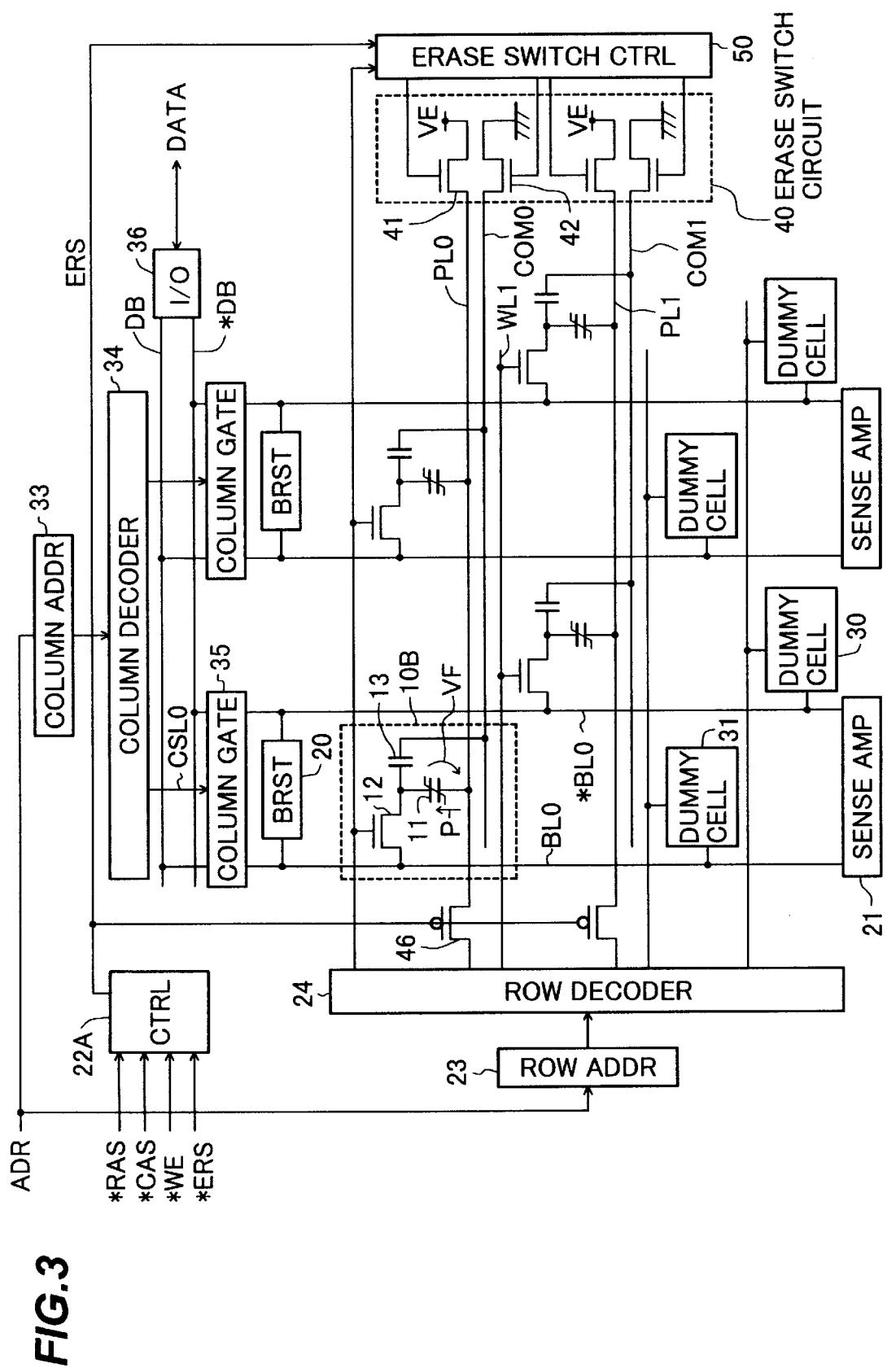
FIG. 3 is a schematic diagram showing a ferroelectric memory device according to the second embodiment of the present invention.

FIG. 3 shows a schematic structure of a ferroelectric memory device according to the second embodiment of the present invention.

This device is provided with an erase switch control circuit 50 for the erase switch circuit 40 in order to make cells erasable row by row. In response to the erase signal ERS from the control circuit 22A, the erase switch control circuit 50 turns off only transistors, in the erase switch circuit 40, corresponding to the row selected by the row decoder 24.

Figure 4:
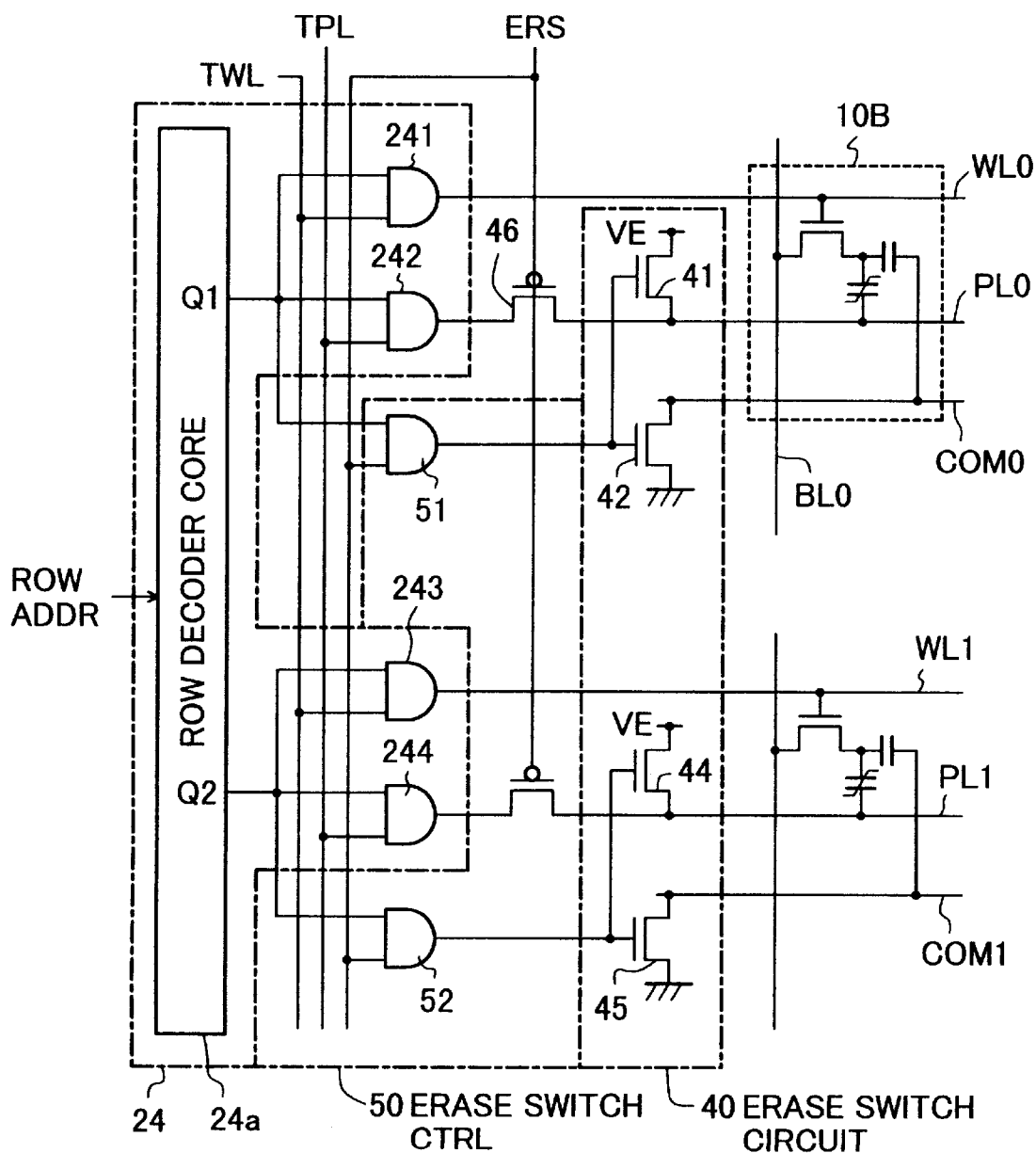
FIG. 4 is a circuit diagram showing a structural example of part of the ferroelectric memory device shown in FIG. 3.

FIG. 4 shows a structural example of part of the circuit in FIG. 3.

The row decoder 24 is provided with a row decoder core 24a and AND gates 241 through 244 in the output stage. When the row address is 0, the row decoder core 24a makes outputs Q1 and Q2 turn to "1" and "0", respectively, and when the row address is 1, the row decoder core 24a makes outputs Q1 and Q2 turn to "0" and "1", respectively. The output Q1 is provided to one input of each of the AND gates 241 and 242, and the output Q2 is provided to one input of each of the AND gates 243 and 244.

A word line timing signal TWL from the control circuit 22A in FIG. 3 is provided to the other input of each of the AND gates 241 and 243. The signal TWL changes high at the time t1 in FIG. 13 or FIG. 14, and changes low at the time t5. The word lines WL0 and WL1 are connected to the output of the AND gates 241 and 243, respectively.

A plate line timing signal TPL from the control circuit 22A in FIG. 3 is provided to the other input of each of the AND gates 242 and 244. The signal TPL changes high at the time t1 in FIG. 13 or FIG. 14, and changes low at the time t4. The plate lines PL0 and PL1 are connected through the transistor switch 46 and the other switch to the output of the AND gates 242 and 244, respectively.

The erase switch control circuit 50 is provided with AND gates 51 and 52, and the outputs Q1 and Q2 are provided from the row decoder core 24a to one input of the AND gates 51 and 52. An erase signal ERS is provided from the control circuit 22A in FIG. 3 to the other input of the AND gates 51 and 52. The output of the AND gate 51 is connected to the gate electrodes of the NMOS transistors 41 and 42 in the erase switch circuit 40, and the output of the AND gate 52 is connected to the gate electrodes of the NMOS transistors 44 and 45 in the erase switch circuit 40.

In FIG. 3, a row address is provided to the row address buffer register 23, the control circuit 22A provides a latch signal to the clock input of the row address buffer register 23 in response to a fall of the row address strobe signal *RAS. The output of the row address buffer register 23 is decoded by the row decoder 24a. The erase signal ERS is raised at the time t1 in FIG. 2, and the output of the erase switch control circuit 50 is enabled, whereby the erasing of the selected memory cell row is carried out.

Next, the control circuit 22A lets the erase signal ERS fall at the time t2 in response to a rise of the row address strobe signal *RAS, whereby the output of the erase switch control circuit 50 is disabled, and the erase operation is completed.

If memory cells whose number is less than that of a row and to be erased remains after erasing memory cells row by row, the remained memory cells are addressed and erased one by one with writing "0" as in the prior art.

Thus, it is possible to erase any number of memory cells at a high speed.

Third Embodiment

Figure 5:
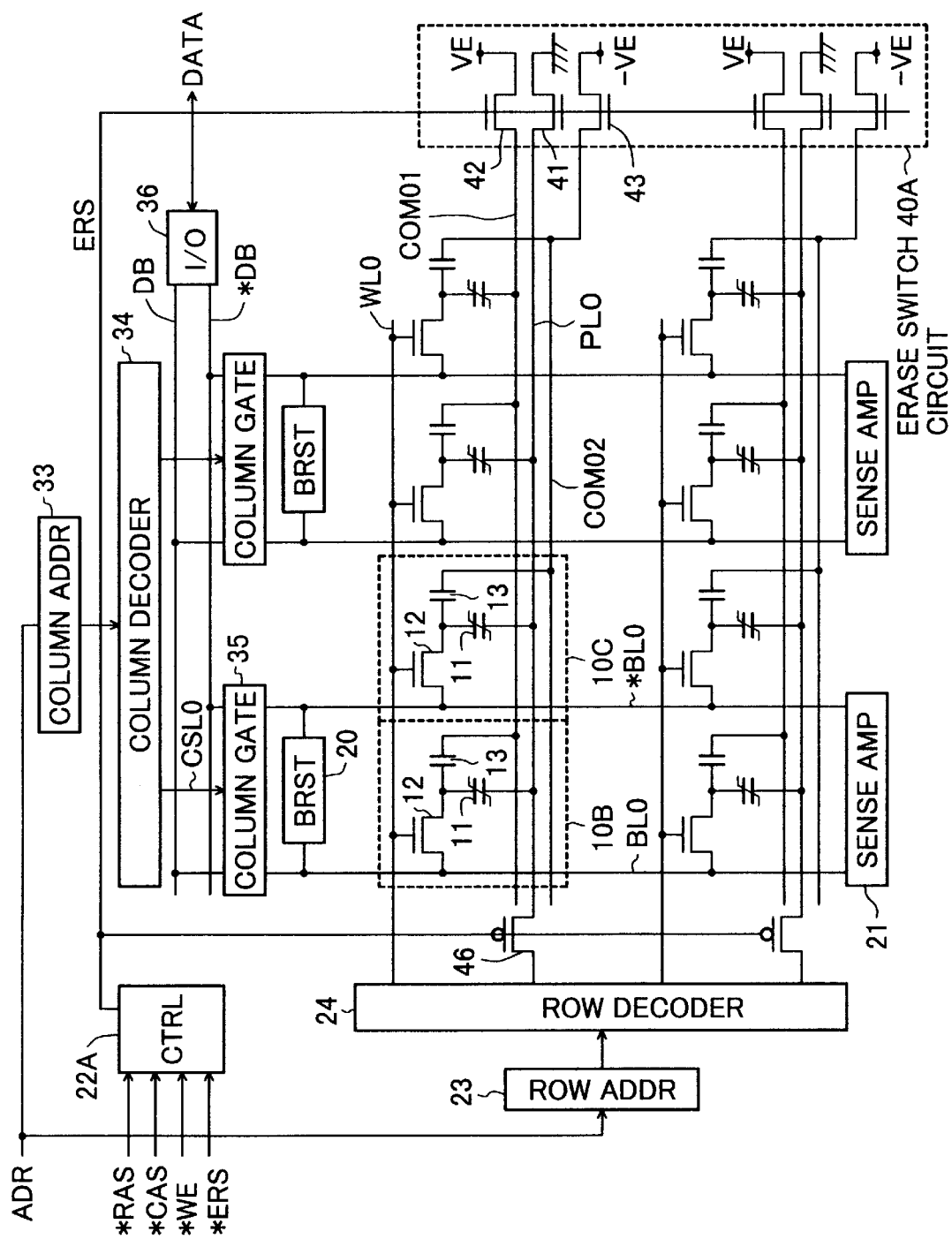
FIG. 5 is a schematic diagram showing a ferroelectric memory device according to the third embodiment of the present invention.

FIG. 5 shows a schematic structure of a ferroelectric memory device according to the third embodiment of the present invention. Parts which are identical to those in FIG. 15 are given the same reference characters, and their description is omitted.

Figure 15:
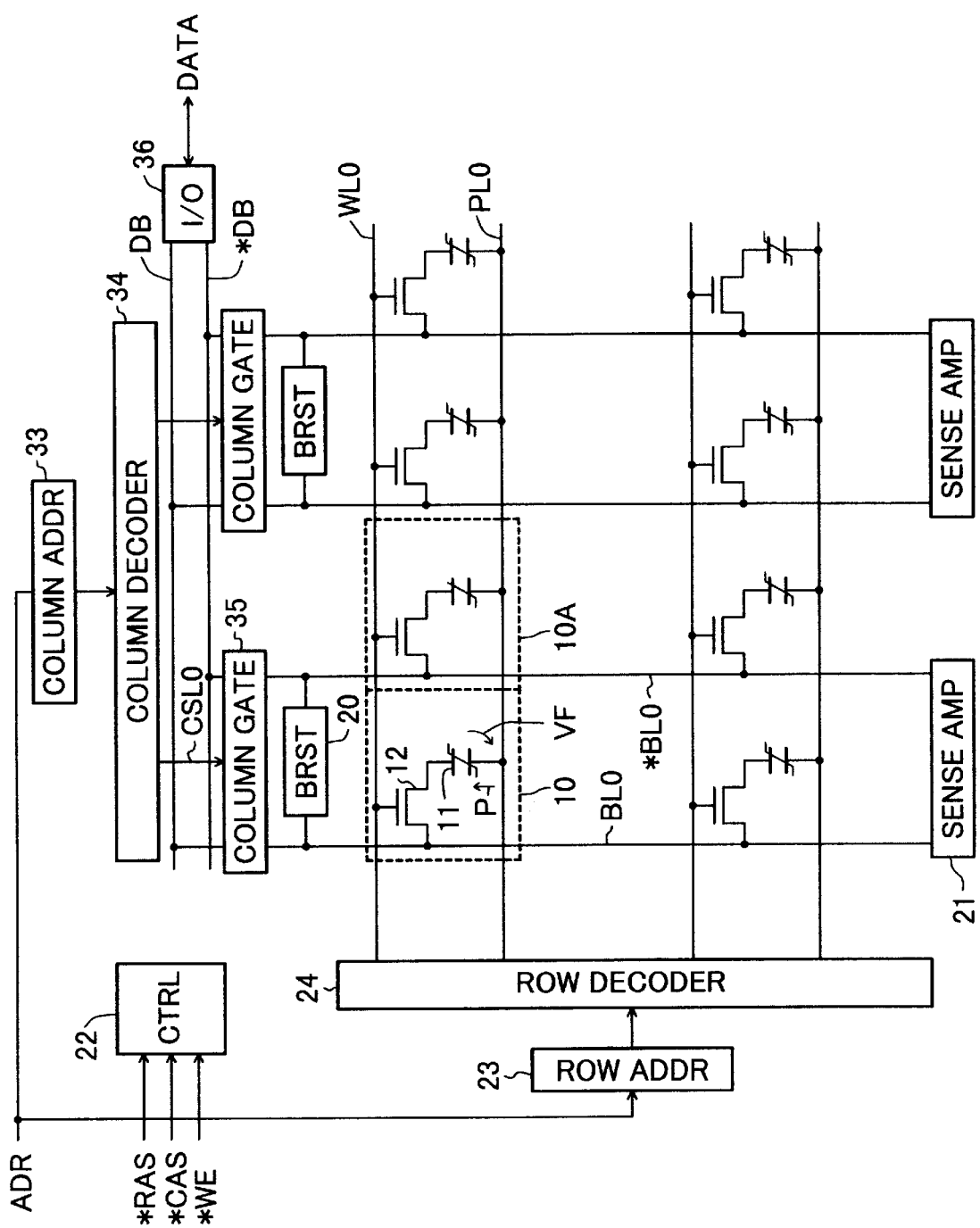
FIG. 15 is a schematic diagram showing another ferroelectric memory device in the prior art.

Memory cells 10B and 10C correspond to the memory cells 10 and 10A in FIG. 15, respectively. The memory cells 10B and 10C each are the same construction as the memory cell 10B in FIG. 1. However, one plate electrode of the coupling capacitor 13 in the memory cell 10C is connected to a common line COM02 independent from the common line COM01 while one plate electrode of the coupling capacitor 13 in the memory cell 10B is connected to the common line COM01. This is the same for other columns in the same row of the memory cell array.

The common line COM01 is connected via an NMOS transistor 42 in the erase switch circuit 40A to a conductor at an erase potential VE, and the common line COM02 is connected via an NMOS transistor 43 in the erase switch circuit 40A to a conductor at an erase potential −VE. The plate line PL0 is connected via an NMOS transistor 41 in the erase switch circuit 40A to a conductor at a ground potential.

This is the same for other rows.

The gate electrodes of the NMOS transistors in the erase switch circuit 40A are commonly connected to each other and thereto, the erase signal ERS from the control circuit 22A is provided.

Other structures are the same as in FIG. 15.

The control circuit 22A raises the erase signal ERS in response to a fall of the erase signal *ERS, whereby all the transistors in the erase switch circuit 40A are turned on. Thus, the erase potential VE is applied to the series circuit of the ferroelectric capacitor 11 and the coupling capacitor 13 in regard to the memory cell 10B, and the erase potential −VE is applied thereto in regard to the memory cell 10C. Therefore, "1" is stored in the memory cell 10B, and its complementary "0" is stored in the memory cell 10C, whereby the memory contents are erased. This is the same for other memory cells.

Fourth Embodiment

Figure 6:
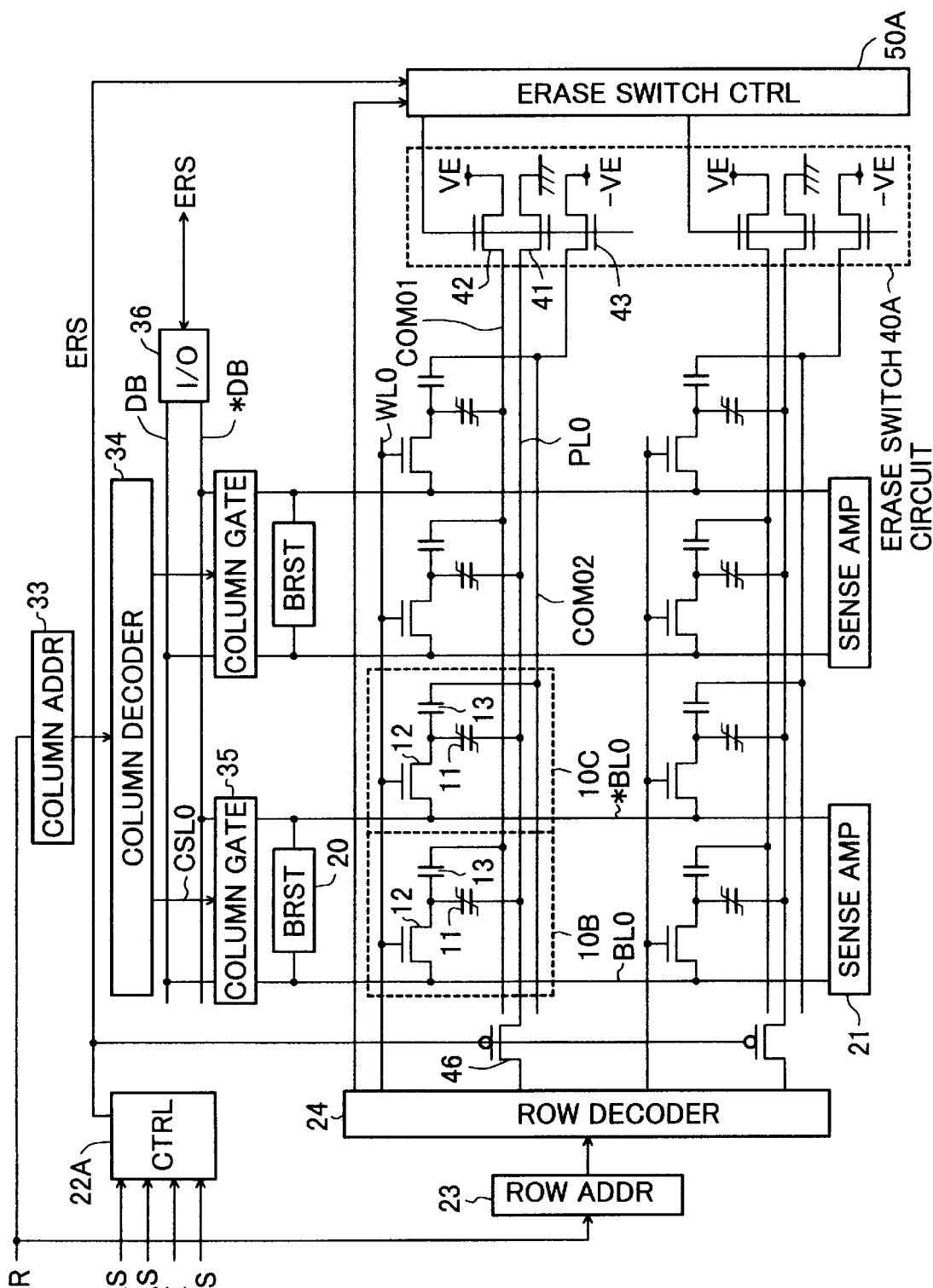
FIG. 6 is a schematic diagram showing a ferroelectric memory device according to the fourth embodiment of the present invention.

FIG. 6 shows a schematic structure of a ferroelectric memory device according to the fourth embodiment of the present invention.

This device is provided with an erase switch control circuit 50A for the erase switch circuit 40A as identical to FIG. 3, whereby the contents of memory cells can be erased row by row.

Fifth Embodiment

As shown in FIG. 1, since a capacitor (13) independent from a ferroelectric capacitor (11) is provided for each memory cell, the cell area increases more than in the prior art.

Figure 7:
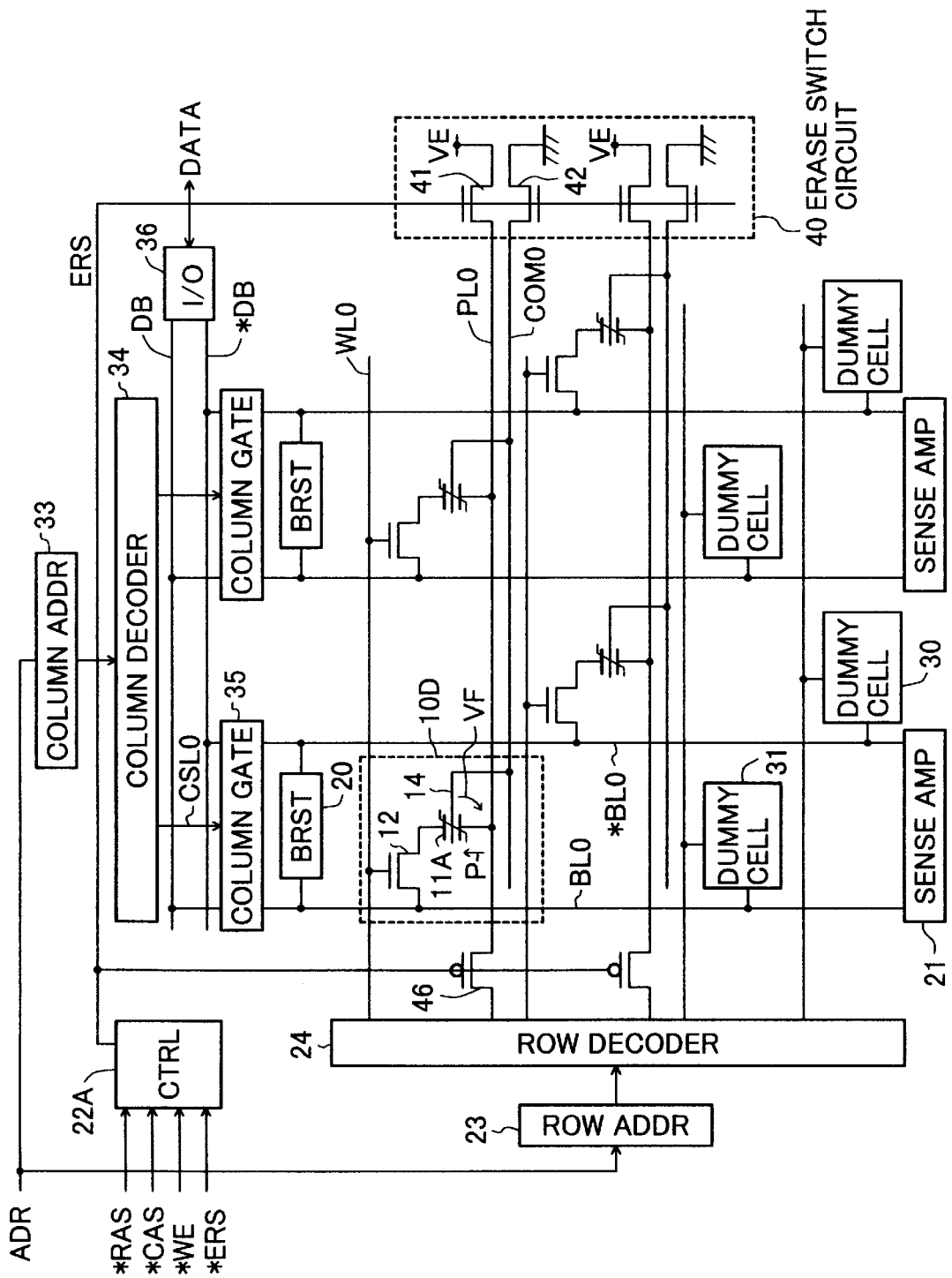
FIG. 7 is a schematic diagram showing a ferroelectric memory device according to the fifth embodiment of the present invention.

Therefore, in a ferroelectric memory device according to the fifth embodiment of the present invention, as shown in FIG. 7, the coupling capacitor 13 in FIG. 1 is omitted with using a ferroelectric capacity 11A having an intermediate plate electrode 14 disposed between an opposed plate electrode pair. It is preferable in view of improvement in the erasing degree that the intermediate plate electrode 14 between the plate electrode pair is located nearer to the plate electrode at the transfer gate 12 side than the central position in the plate electrode pair. The intermediate plate electrode 14 is connected to the common line COM0 which is common to the memory cells in the same row.

Other constructions are the same as that in FIG. 1.

Figure 8:
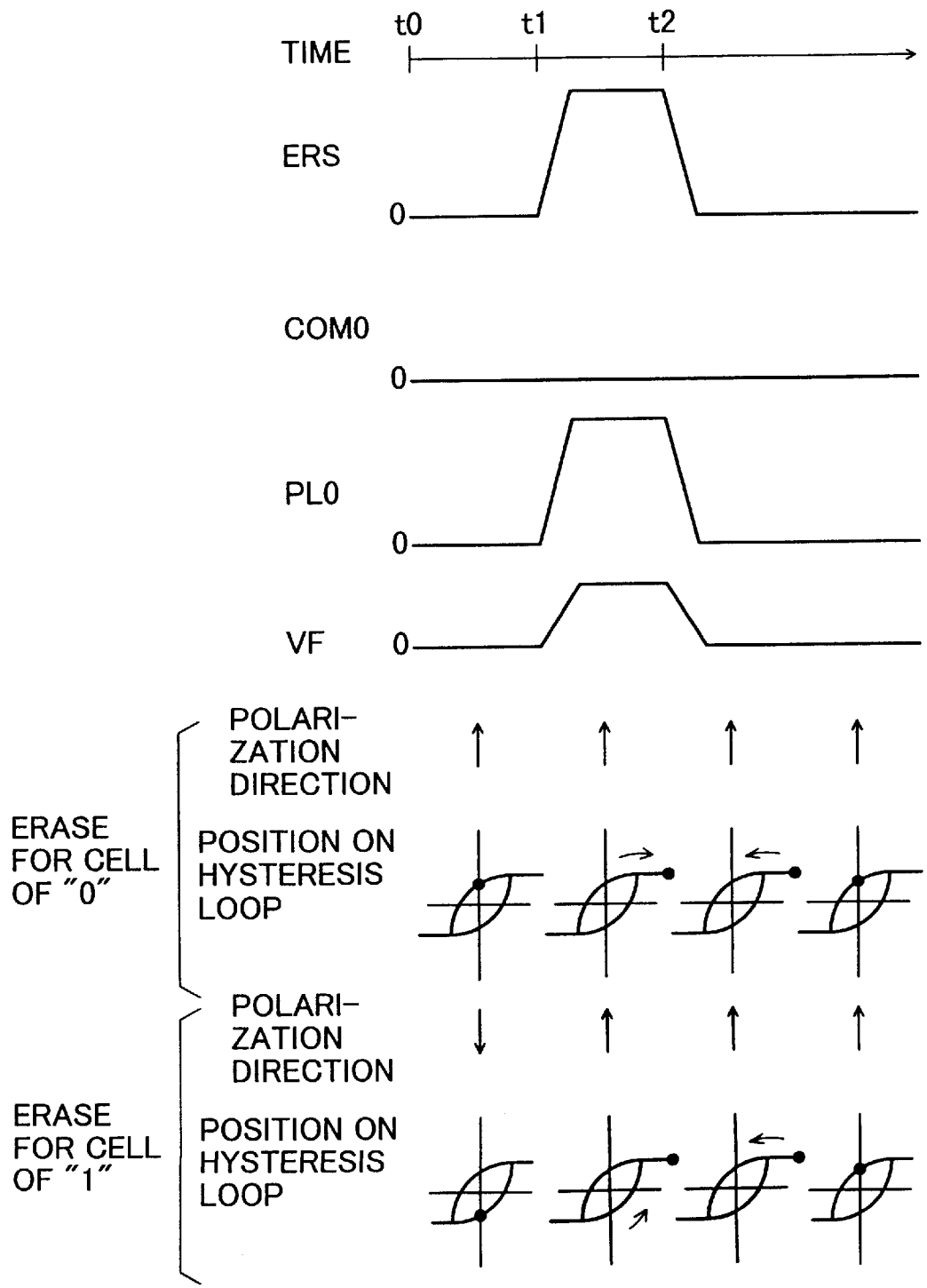
FIG. 8 are time charts showing erase operation of the device shown in FIG, 7.

FIG. 8 are time charts showing an erase operation of the device of FIG. 7, wherein the states of ferroelectric are denoted as black points on hysteresis loops with respect to erase by writing "0" into a cell of "0" and a cell of "1".

The erase operation is the same as in the case of FIG. 2. However, the plate electrode at the transfer gate 12 side of the ferroelectric capacitor 11 is in a floating state, and the erase potential VE is applied between the intermediate plate electrode 14 and the plate electrode at the plate PL0 side of the ferroelectric capacitor 11, whereby only the part therebetween is erased. Therefore, the ferroelectric capacity 11A as a whole becomes a weaker erase state than in FIG. 1. Further, since the erase voltage VE is applied to this part, the voltage can be made lower than the voltage VE in the case of FIG. 1.

Sixth Embodiment

Figure 9:
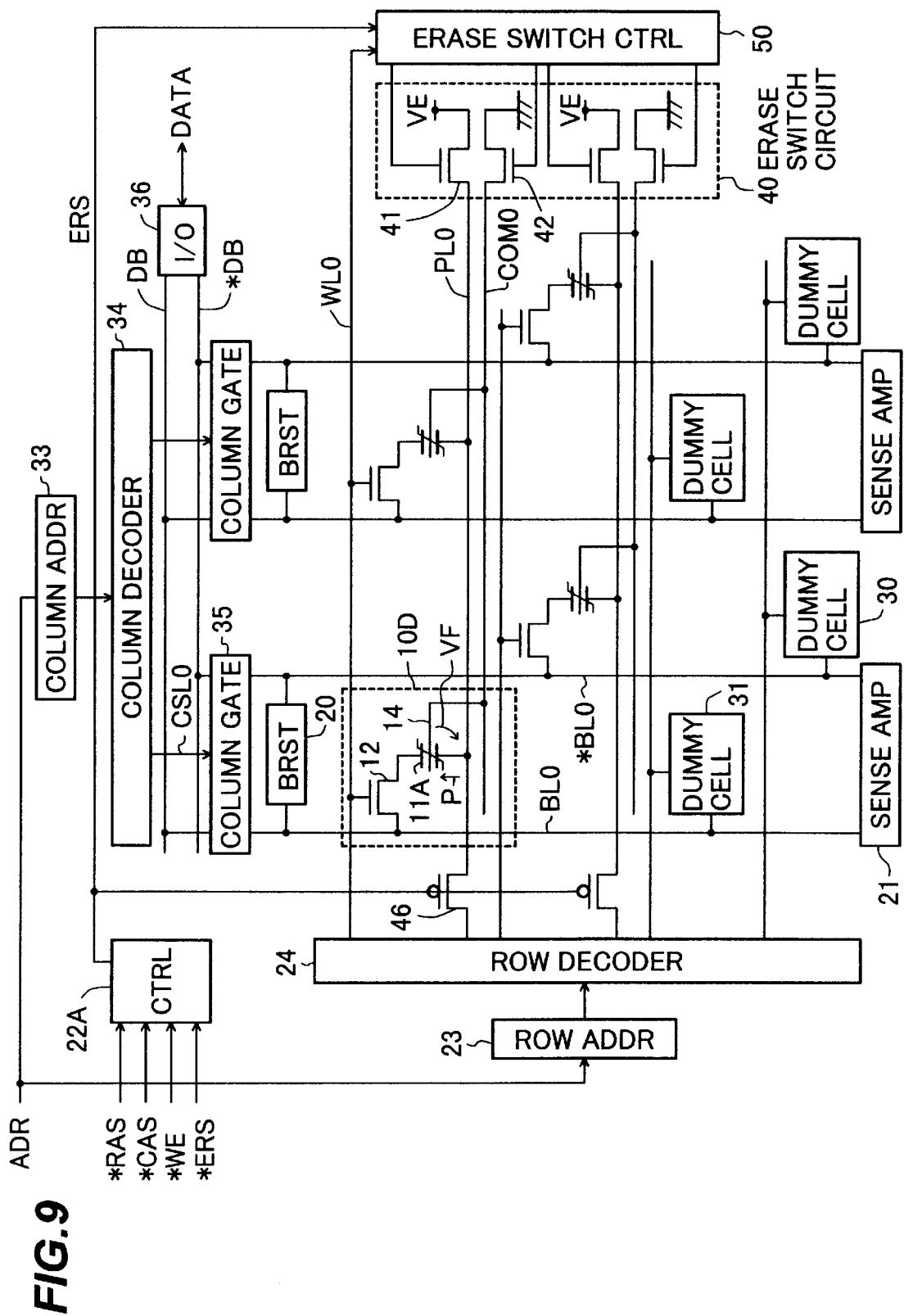
FIG. 9 is a schematic diagram showing a ferroelectric memory device according to the sixth embodiment of the present invention.

FIG. 9 shows a schematic structure of a ferroelectric memory device according to the sixth embodiment of the present invention.

This device is such that the erase switch control circuit 50 is added to the device shown in FIG. 7, and the contents of memory cells can be erased row by row as in the case of FIG. 3.

Seventh Embodiment

Figure 10:
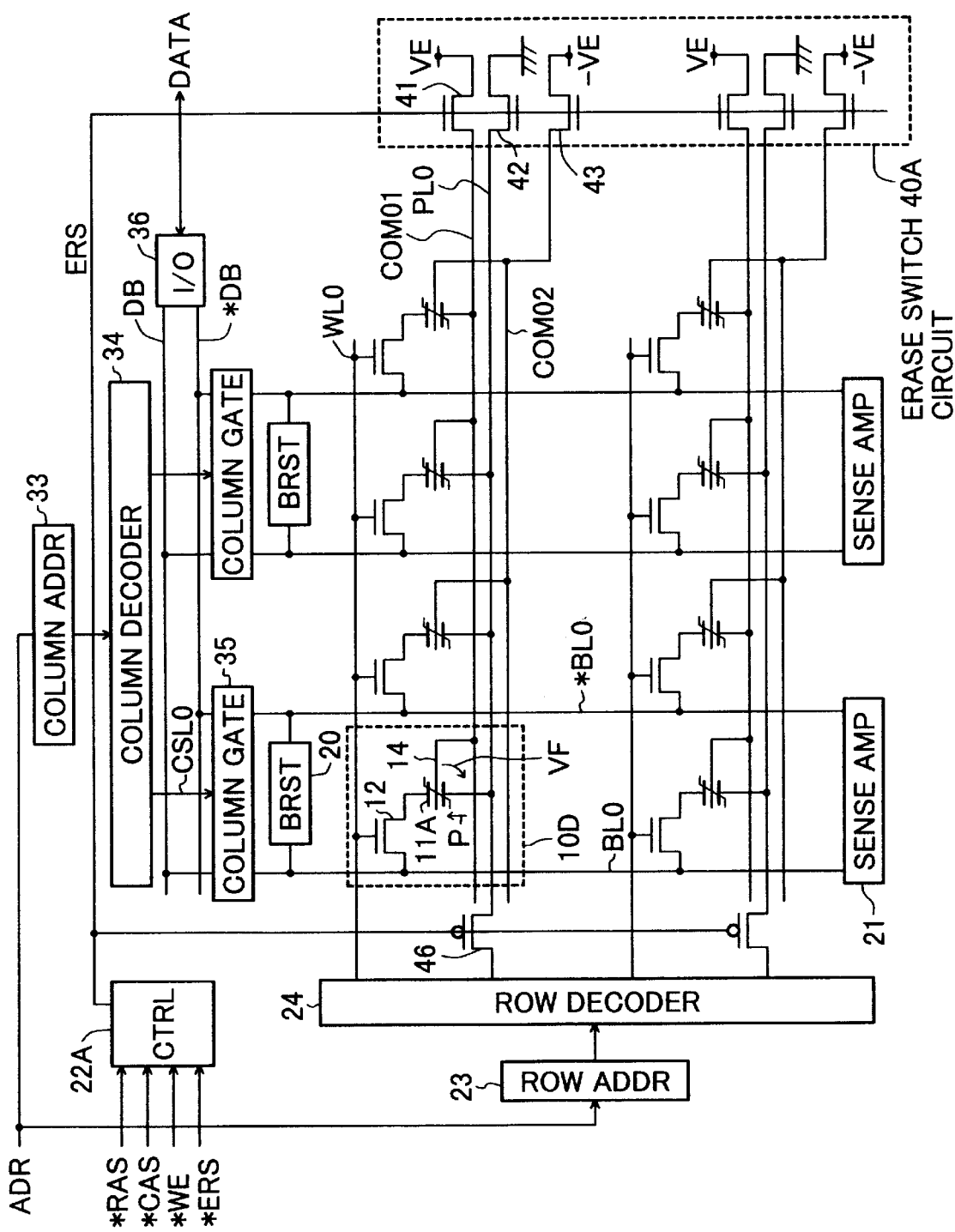
FIG. 10 is a schematic diagram showing a ferroelectric memory device according to the seventh embodiment of the present invention.

FIG. 10 shows a schematic structure of a ferroelectric memory device according to the seventh embodiment of the present invention.

The device is such that the memory cells employed in FIG. 5 are replaced by that employed in FIG. 7.

Eighth Embodiment

Figure 11:
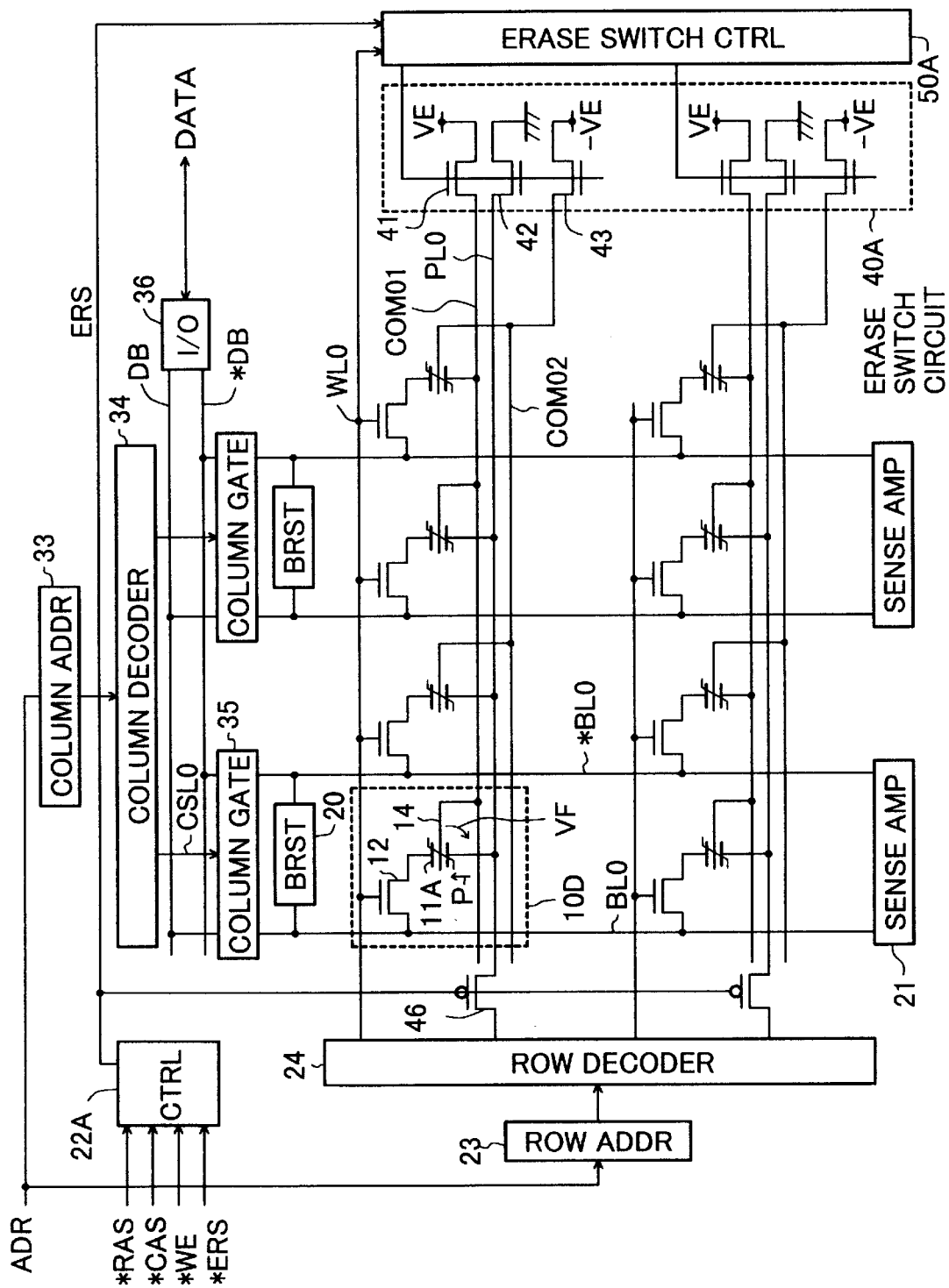
FIG. 11 is a schematic diagram showing a ferroelectric memory device according to then eighth embodiment of the present invention.

FIG. 11 shows a schematic structure of a ferroelectric memory device according to the eighth embodiment of the present invention.

In this device, the erase switch control circuit 50A is added to the device of FIG. 10, and as identical in FIG. 6, the contents of memory cells can be erased row by row.

Although preferred embodiments of the present invention has been described, it is to be understood that the invention is not limited thereto and that various changes and modifications may be made without departing from the spirit and scope of the invention.

For example, it is clear that the polarity of voltage applied for erase may be reverse in the case of the above each embodiment.

In the above embodiments, although erase switches are connected to respective common lines in the same row, an erase switch may be connected to a plurality of common lines among a plurality of rows.

In addition, in FIG. 7, by exchanging the connection destination of one end of the transfer gate 12 toward the ferroelectric capacitor 11A and the connection destination of the common line COM0 toward the ferroelectric capacitor 11A, it is possible to make a capacitor having the intermediate plate electrode 14 and the transfer gate 12 side plate electrode of the ferroelectric capacitor 11A correspond to the coupling capacitor 13 in FIG. 1, and to make a capacitor having the intermediate plate electrode 14 and the plate line PL0 side plate electrode of the ferroelectric capacitor 11A correspond to the coupling capacitor 13 in FIG. 1. In this case, although it is necessary to increase the erase potential VE greater than in the case where the connection destinations are not exchanged, it is possible to erase the ferroelectric capacitor 11A as a whole by an erase operation. This exchange is applicable to the embodiments in FIGS. 9 through 11.

What is claimed is:

1. A ferroelectric memory device comprising ferroelectric memory cell array in rows and columns, each ferroelectric memory cell of a part of said memory cell array including:
   a ferroelectric capacitor having first and second plate electrodes, said second plate electrode being connected to a plate line;
   a transfer gate having a control input and a current pass, said current pass being connected between a bit line and said first plate electrode; and
   a coupling capacitor connected between said first plate electrode and a common line,
   wherein said bit line is common to memory cells in the same column, said plate line is common to memory cells in the same row, and said common line is common to memory cells in the same row,
   wherein said ferroelectric memory device further comprising:
      a first erase switch having a control input and a current pass, said current pass thereof being connected between said plate line and a conductor at a first potential, said first erase switch being turned on in response to an erase signal; and
      a second erase switch having a control input and a current pass, said current pass thereof being connected between said common line and a conductor at a second potential, said second erase switch being turned on in response to said erase signal.

2. A ferroelectric memory device according to claim 1, wherein said first and second erase switches are provided for each of said rows.

3. A ferroelectric memory device according to claim 2, wherein said erase signal is provided commonly to said control inputs of a plurality of sets of said first and second erase switches.

4. A ferroelectric memory device according to claim 2, further comprising an erase switch control circuit for selectively providing said erase signal to said control inputs of selected one set, which corresponds to a selected row by a row address, of said first and second erase switches.

5. A ferroelectric memory device according to claim 1, wherein each ferroelectric memory cell of another part of said memory cell array includes:
   a complementary ferroelectric capacitor having first and second plate electrodes, said second plate electrode thereof being connected to said plate line;
   a complementary transfer gate having a control input and a current pass, said current pass thereof being connected between a complementary bit line and said first plate electrode of said complementary ferroelectric capacitor; and
   a complementary coupling capacitor connected between said first plate electrode of said complementary ferroelectric capacitor and a complementary common line,
   wherein said complementary bit line is common to memory cells in the same column, said plate line is common to memory cells in the same row, and said complementary common line is common to memory cells in the same row, and wherein said ferroelectric memory device further comprises a third erase switch having a control input and a current pass, said current pass thereof being connected between said complementary common line and a conductor at a third potential, said third erase switch being turned on in response to said erase signal.

6. A ferroelectric memory device according to claim 5, wherein said first, second and third erase switches are provided for each of said rows.

7. A ferroelectric memory device according to claim 6, wherein said erase signal is provided commonly to said control inputs of a plurality of sets of said first, second and third erase switches.

8. A ferroelectric memory device according to claim 6, further comprising an erase switch control circuit for selectively providing said erase signal to said control inputs of selected one set, which corresponds to a selected row by a row address, of said first, second and third erase switches.

9. A ferroelectric memory device comprising ferroelectric memory cell array in rows and columns, each ferroelectric memory cell of a part of said memory cell array including:

a ferroelectric capacitor having first, intermediate and second plate electrodes, said intermediate plate electrode being disposed between said first and second plate electrodes, said intermediate plate electrode being connected to a common line, said second plate electrode being connected to a plate line; and a transfer gate having a control input and a current pass, said current pass being connected between a bit line and said first plate electrode, wherein said bit line is common to memory cells in the same column, said plate line is common to memory cells in the same row, and said common line is common to memory cells in the same row, said ferroelectric memory device further comprising:

a first erase switch having a control input and a current pass, said current pass thereof being connected between said plate line and a conductor at a first potential, said first erase switch being turned on in response to an erase signal; and a second erase switch having a control input and a current pass, said current pass thereof being connected between said common line and a conductor at a second potential, said second erase switch being turned on in response to said erase signal.

10. A ferroelectric memory device according to claim 9, wherein said first and second erase switches are provided for each of said rows.

11. A ferroelectric memory device according to claim 10, wherein said erase signal is provided commonly to said control inputs of a plurality of sets of said first and second erase switches.

12. A ferroelectric memory device according to claim 10, further comprising an erase switch control circuit for selectively providing said erase signal to said control inputs of selected one set, which corresponds to a selected row by a row address, of said first and second erase switches.

13. A ferroelectric memory device according to claim 9, wherein each ferroelectric memory cell of another part of said memory cell array includes:

a complementary ferroelectric capacitor having first, intermediate and second plate electrodes, said intermediate plate electrode thereof being disposed between said first and second plate electrodes thereof, said intermediate plate electrode thereof being connected to a complementary common line, said second plate electrode thereof being connected to said plate line; and a transfer gate having a control input and a current pass, said current pass being connected between a complementary bit line and said first plate electrode of said complementary ferroelectric capacitor, wherein said complementary bit line is common to memory cells in the same column, said plate line is common to memory cells in the same row, and said complementary common line is common to memory cells in the same row, and wherein said ferroelectric memory device further comprises a third erase switch having a control input and a current pass, said current pass thereof being connected between said complementary common line and a conductor at a third potential, said third erase switch being turned on in response to said erase signal.

14. A ferroelectric memory device according to claim 13, wherein said first, second and third erase switches are provided for each of said rows.

15. A ferroelectric memory device according to claim 14, wherein said erase signal is provided commonly to said control inputs of a plurality of sets of said first, second and third erase switches.

16. A ferroelectric memory device according to claim 13, further comprising an erase switch control circuit for selectively providing said erase signal to said control inputs of selected one set, which corresponds to a selected row by a row address, of said first, second and third erase switches.

* * * * *